(12) United States Patent
DiRocco et al.

(10) Patent No.: US 9,658,255 B2
(45) Date of Patent: May 23, 2017

(54) SIGNAL MONITORING OF THROUGH-WAFER VIAS USING A MULTI-LAYER INDUCTOR

(71) Applicant: International Business Machines Corporation, Armonk, NY (US)

(72) Inventors: Mark A. DiRocco, South Burlington, VT (US); Kirk D. Peterson, Jericho, VT (US); Norman W. Robson, Hopewell Junction, NY (US); Keith C. Stevens, Fairfield, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/831,151

(22) Filed: Aug. 20, 2015

(65) Prior Publication Data

US 2015/0362534 A1    Dec. 17, 2015

Related U.S. Application Data

(62) Division of application No. 14/146,162, filed on Jan. 2, 2014, now Pat. No. 9,372,208.

(51) Int. Cl.

| | |
|---|---|
| *H01L 49/02* | (2006.01) |
| *H01L 23/48* | (2006.01) |
| *G01R 17/00* | (2006.01) |
| *G01R 19/00* | (2006.01) |
| *H01L 21/66* | (2006.01) |

(Continued)

(52) U.S. Cl.
CPC ............ *G01R 17/00* (2013.01); *G01R 19/00* (2013.01); *G01R 31/2853* (2013.01); *H01L 21/76898* (2013.01); *H01L 22/14* (2013.01); *H01L 22/34* (2013.01); *H01L 23/481* (2013.01); *H01L 28/10* (2013.01); *H01L 28/40* (2013.01); *G01R 31/2648* (2013.01); *H01L 23/5227* (2013.01); *H01L 2225/06544* (2013.01); *H01L 2225/06596* (2013.01); *H01L 2924/0002* (2013.01); *H01L 2924/19042* (2013.01); *H01L 2924/19104* (2013.01)

(58) Field of Classification Search
CPC ......... H01L 49/02; H01L 23/48; G01R 17/00; G01R 19/00
USPC .............................. 257/621, 528; 324/117 H
See application file for complete search history.

(56) References Cited

U.S. PATENT DOCUMENTS

| | | |
|---|---|---|
| 3,840,802 A | 10/1974 | Anthony |
| 4,060,760 A | 11/1977 | Rogachev et al. |

(Continued)

OTHER PUBLICATIONS

U.S. Appl. No. 14/146,162, Office Action Communication Dated Mar. 6, 2015, pp. 1-6.

(Continued)

*Primary Examiner* — Sheng Zhu
(74) *Attorney, Agent, or Firm* — Gibb & Riley, LLC; Steven J. Meyers

(57) ABSTRACT

According to a method herein, a multi-level inductor is created around a through-silicon-via (TSV) in a semiconductor substrate. A voltage induced in the multi-level inductor by current flowing in the TSV is sensed, using a computerized device. The voltage is compared to a reference voltage, using the computerized device. An electrical signature of the TSV is determined based on the comparing the voltage to the reference voltage, using the computerized device.

20 Claims, 11 Drawing Sheets

(51) Int. Cl.
    *H01L 21/768*   (2006.01)
    *G01R 31/28*    (2006.01)
    G01R 31/26      (2014.01)
    H01L 23/522     (2006.01)

(56)            References Cited

U.S. PATENT DOCUMENTS

| | | | | |
|---|---|---|---|---|
| 5,253,475 | A | * | 10/1993 | Kabasin ........................ 60/274 |
| 5,579,194 | A | * | 11/1996 | Mackenzie et al. ............ 361/24 |
| 5,963,038 | A | | 10/1999 | De Jong et al. |
| 6,291,872 | B1 | | 9/2001 | Wang et al. |
| 7,400,025 | B2 | | 7/2008 | Pitts et al. |
| 7,619,431 | B2 | | 11/2009 | De Wilde et al. |
| 7,990,132 | B2 | | 8/2011 | Dupuis et al. |
| 8,344,503 | B2 | | 1/2013 | Sanders et al. |
| 8,400,139 | B2 | | 3/2013 | Ausserlechner |
| 8,471,358 | B2 | | 6/2013 | Yen et al. |
| 2010/0127345 | A1 | * | 5/2010 | Sanders et al. .............. 257/528 |
| 2010/0176793 | A1 | * | 7/2010 | Michalak ................. 324/117 H |
| 2012/0056680 | A1 | | 3/2012 | Kim et al. |

OTHER PUBLICATIONS

U.S. Appl. No. 14/146,162, Office Action Communication Dated Apr. 16, 2015, pp. 1-7.
U.S. Appl. No. 14/146,162, Office Action Communication Dated Jul. 9, 2015, pp. 1-10.
U.S. Appl. No. 14/146,162, Office Action Communication Dated Dec. 4, 2015, pp. 1-13.
U.S. Appl. No. 14/146,162, Office Action Communication Dated Mar. 22, 2016, pp. 1-7.

* cited by examiner

SIGNAL MONITORING OF THROUGH-WAFER VIAS USING A MULTI-LAYER INDUCTOR

CROSS-REFERENCE TO RELATED APPLICATIONS

The present application claims the benefit under 35 U.S.C. §120 as a divisional of pending U.S. patent application Ser. No. 14/146,162, filed on Jan. 2, 2014, the entire teachings of which are incorporated herein by reference.

BACKGROUND

The present disclosure relates generally to integrated circuit devices, and more specifically, to a device to monitor electrical activity in a through-silicon-via (TSV).

An integrated circuit (IC) is a semiconductor device containing many small, interconnected components such as diodes, transistors, resistors, and capacitors. These components function together to enable the IC to perform a task, such as control an electronic device, or perform logic operations. ICs are found in computers, calculators, cellular telephones, and many other electronic devices.

ICs and other semiconductor devices are fabricated on small rectangles, known as "dies," which are filled with multiple layers of the components, such as transistors, resistors, and capacitors, during the fabrication process. The connections between the layers are known as through-silicon-vias (TSVs), or vias, for short. In integrated circuit design, a via is a small opening in an insulating oxide layer that allows a conductive connection between different layers.

A manufacturing error in one of the components may render an IC or semiconductor device incapable of functioning properly. For example, consider a memory device containing several ICs. If a transistor within one of the ICs fails to function properly, the memory device may produce memory errors. Vias are also subject to manufacturing errors. When a manufacturing error occurs in a via, the via may not conduct properly and thus may prohibit an IC from functioning correctly. For instance, an open via or a partially open via is a break in the circuit, which may prohibit a device from functioning as designed. An open via may have a high or infinite resistance, and a partially open via may have a higher than average resistance. On the other hand, the via could be shorted to a neighbor interconnect line or via, which may also prohibit a device from functioning as designed. Therefore, testing via structures is a fundamental aspect of IC production and reliability.

SUMMARY

According to devices and methods herein, a multi-level inductor is created around a TSV. The multi-level inductor will sense signals coming through the TSV. This includes, but is not limited to, currents and transients. The inductor senses changes in the power through the TSV and supplies an output value to compare with calculated/expected values for the TSV that is being sensed. The inductively coupled sensor can be fed to any number of circuits, such as amplifiers, multiplexors, comparators, etc., to create an output that may be used to determine the manufacturing quality of die function, operation, and reliability.

According to a method herein, a multi-level inductor is created around a through-silicon-via (TSV) in a semiconductor substrate. A voltage induced in the multi-level inductor by current flowing in the TSV is sensed, using a computerized device. The voltage is compared to a reference voltage, using the computerized device. An electrical signature of the TSV is determined based on comparing the voltage to the reference voltage, using the computerized device.

According to another method herein, a wafer comprising a multilayer silicon substrate is formed. A through-silicon-via (TSV) structure is formed, extending through multiple levels of the multilayer silicon substrate. An inductor is formed in the multilayer silicon substrate surrounding the TSV through multiple levels of the multilayer silicon substrate. A measured voltage induced in the inductor by current flowing in the TSV is determined. The measured voltage is compared to a reference voltage. An output signal indicating resistance of the TSV is provided based on comparing the measured voltage to the reference voltage.

According to a structure herein, a wafer comprises a multilayer silicon substrate. An active device is in a layer of the multilayer silicon substrate. A through-silicon-via (TSV) structure extends through multiple levels of the multilayer silicon substrate and is operatively attached to the active device. An inductor is in the multilayer silicon substrate. The inductor surrounds the TSV through multiple levels of the multilayer silicon substrate. The structure includes a comparator having multiple inputs. A reference voltage is applied to a first input of the comparator. The inductor is connected to ground at a first end and connected to a second input of the comparator at a second end.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
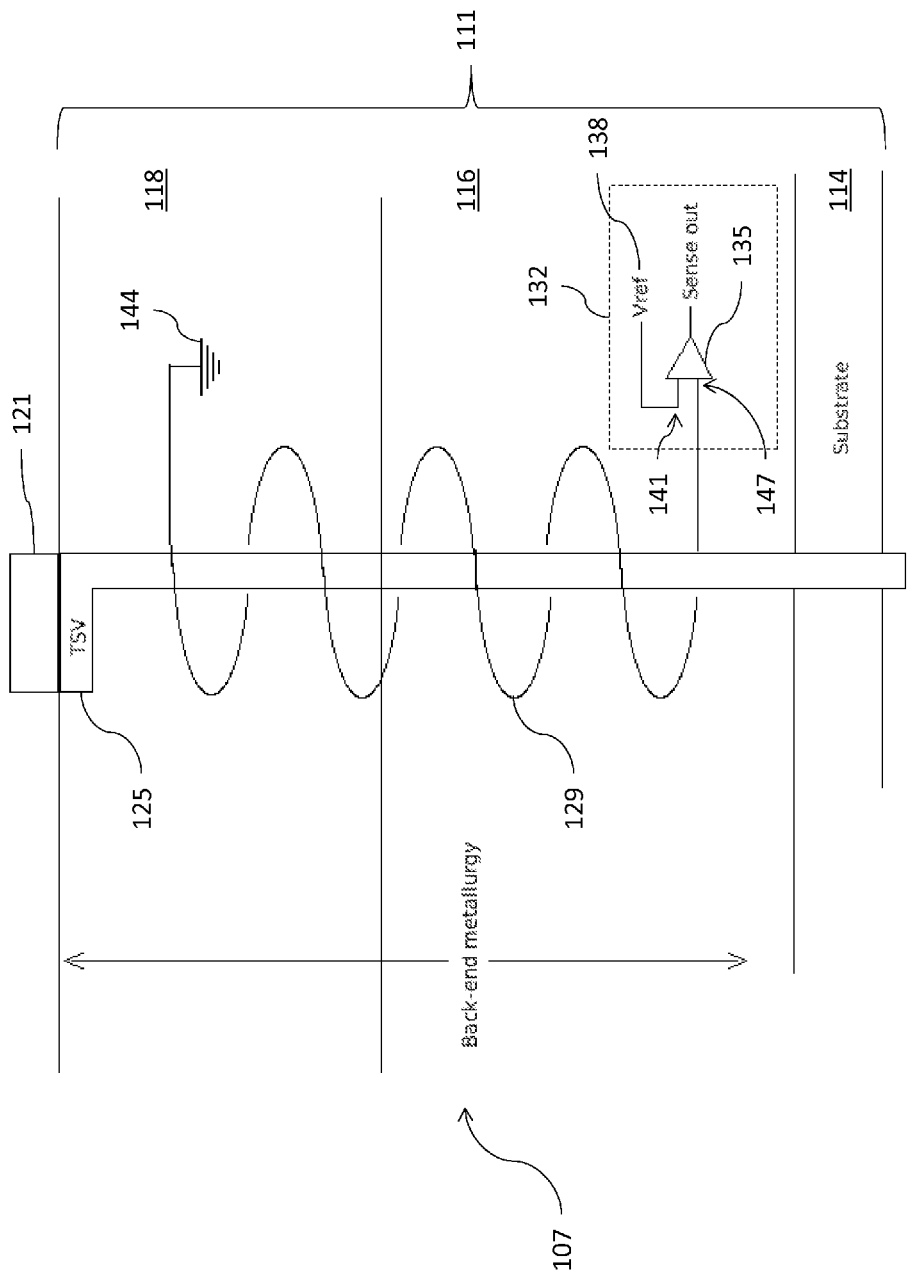
FIG. 1 is a schematic diagram of a semiconductor structure illustrating aspects of devices and methods herein.

It will be readily understood that the devices and methods of the present disclosure, as generally described and illustrated in the drawings herein, may be arranged and designed in a wide variety of different configurations in addition to the devices and methods described herein. Thus, the following detailed description of the devices and methods, as represented in the drawings, is not intended to limit the scope defined by the appended claims, but is merely representative of selected devices and methods. The following description is intended only by way of example, and simply illustrates certain concepts of the devices and methods, as disclosed and claimed herein.

Disclosed herein is a method to actively monitor the electrical activity through a through-silicon-via (TSV) without directly measuring it. The devices and methods herein enable monitoring of opens, current spikes, and other abnormalities on a given TSV. The electrical signature of the TSV can be monitored during test, or within normal operation depending on various possible wiring and detection schemes. Devices and methods herein enable in-situ monitoring of resistance and transients, fault detection, fault localization in x, y, and z dimensions, and active current monitoring. For simplicity, the description below will be directed to detecting high resistance TSVs within a stack of two or more die. It is contemplated that the concepts disclosed herein are applicable to detecting other conditions and other numbers of dies in a stack.

Referring now to the drawings, FIG. 1 shows a portion of a wafer, indicated generally as 107, comprising a multilayer silicon substrate 111 having layers 114, 116, 118. (For clarity, only a limited number of layers are shown in this example. One skilled in the relevant art would recognize that the concepts described herein are equally applicable to structures having different numbers of layers than shown in this example.) An active device 121 (transistor, capacitor, resistor, etc.) may be in one of the layers of the multilayer silicon substrate. A through-silicon-via (TSV) structure 125 extends through multiple levels of the multilayer silicon substrate 111 and is operatively attached to the active device 121. The TSV 125 provides a vertical electrical connection (via) (Vertical Interconnect Access) passing completely through the layers 114, 116, 118 of the silicon substrate 111. TSV 125 may comprise any appropriate conductor material. Non-limiting examples of such conductor material include copper, tungsten, aluminum, and alloys of copper, tungsten, and aluminum. Other materials may be used. In general, TSVs are a high performance technique used to create three-dimensional packages and three-dimensional integrated circuits.

An inductor 129 is formed in the multilayer silicon substrate 111. As shown in FIG. 1, the inductor 129 surrounds the TSV 125 through multiple levels of the multi-layer silicon substrate 111. Furthermore, the inductor 129 comprises a coil having several turns around the TSV 125. Electrical current passing through the TSV 125 induces a voltage in the inductor 129.

The structure includes a comparator circuit 132. The comparator circuit 132 includes a comparator 135 having multiple inputs. A reference voltage (Vref) 138 may be applied to a first input 141 of the comparator. The reference voltage may be any predetermined voltage that is used to match the expected signal strength of the output. As shown in FIG. 1, the inductor 129 may be connected to ground 144 at a first end and connected to a second input 147 of the comparator 135 at a second end.

It is contemplated that the TSV 125 and comparator circuit 132 may be formed during the back end of line (BEOL) processing. As is known in the art, the back end of line (BEOL) is the second portion of integrated circuit fabrication where the individual devices, such as active device 121, are interconnected with wiring on the wafer 107.

According to devices and methods herein, current flowing in the inductor 129 is monitored and the resistance of the TSV is determined. The system shown in FIG. 1 generates a binary output of whether or not the TSV 125 is connected. Essentially, this comprises a test of whether the TSV completes the circuit between layers. It is further contemplated that an inductor such as described above may be employed around a wire in the X, Y plane, as well, in order to determine continuity.

Figure 2:
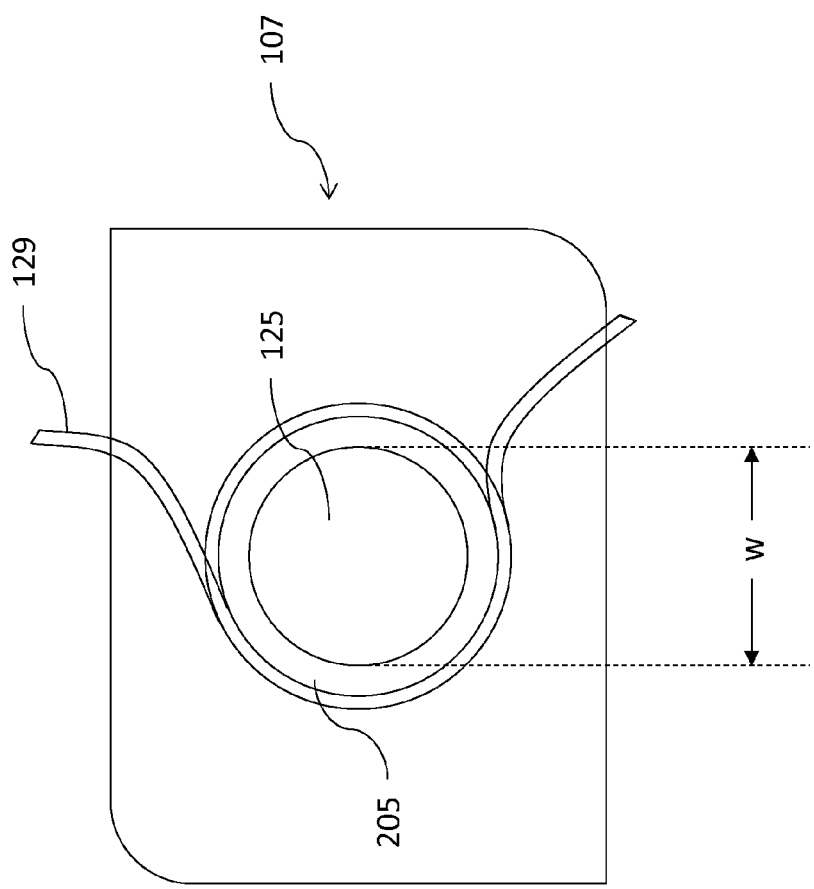
FIG. 2 is a plan view of a through-silicon-via according to devices and methods herein.

FIG. 2 is a simplified plan view of a TSV 125 of diameter or width w. While TSV 125 is shown in FIG. 2 as having a circular cross-section in the plan view, this is merely for convenience of description and not intended to be limiting. That is, TSV 125 can have any plan view cross-sectional shape, such as square, rectangular, polygonal, elliptical, and so forth. An annular space 205 remains between the TSV 125 and the inductor 129. The annular space 205 should be wide enough to avoid dielectric breakdown and will depend upon the expected current through the TSV 125. This will depend upon the particular function being performed by the active device 121 and is within the competence of persons of skill in the art. The inductor 129 is designed to provide an inductance voltage that is large enough to produce a meaningful measurement and yet small enough to not to destroy any design point of the TSV 125, such as impedance or other performance measurements.

Figure 3:
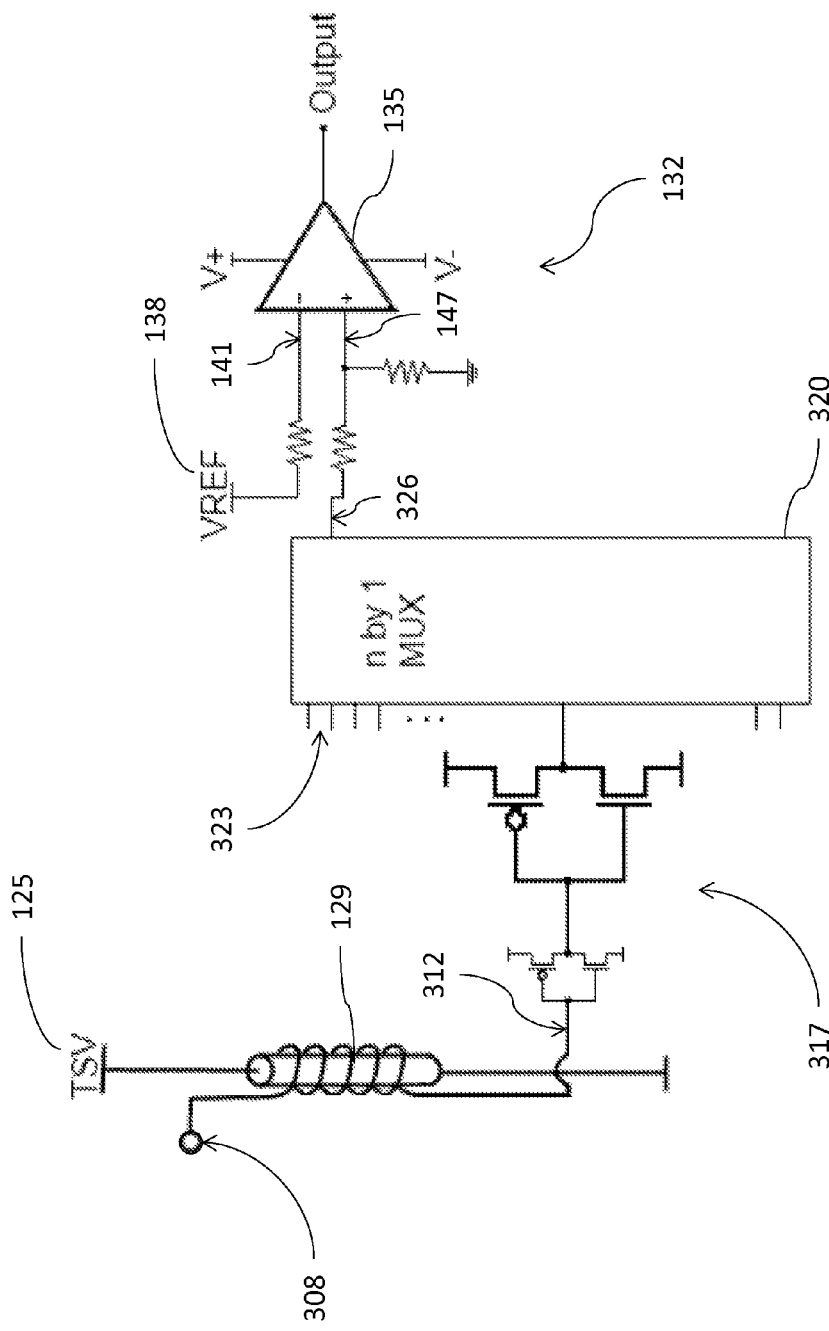
FIG. 3 is a circuit diagram according to devices and methods herein.

FIG. 3 shows a circuit diagram illustrating an example for comparison of a TSV voltage to a single known voltage level. In this configuration, the first end 308 of the inductor 129 may be connected to ground or to a sensing connection. The second end 312 of the inductor may be connected to an amplifier 317. Varying current in the TSV 125 is sensed with inductor 129 and amplified by amplifier 317 for evaluation by the comparator circuit 132.

FIG. 3 shows a single TSV 125 in combination with an inductor 129 providing input to a single multiplexer (MUX) 320. As is known in the art, multiple TSVs may be used in a single wafer. As shown in FIG. 3, multiplexer 320 may be an n by 1 device. That is, multiplexer 320 may have multiple inputs 323 (at least one for each TSV) and a single output 326. The reference voltage 138 may be used to match the expected signal strength from the multiplexer 320. Such reference voltage 138 may be determined empirically. In some cases, the reference voltage 138 may comprise a known value from previously calculated design data or a set of historical measurements. While FIG. 3 shows the single output 326 and the reference voltage 138 as being hardwired, it is contemplated that all the components in the circuit from the amplifier down are reconfigurable.

Figure 4:
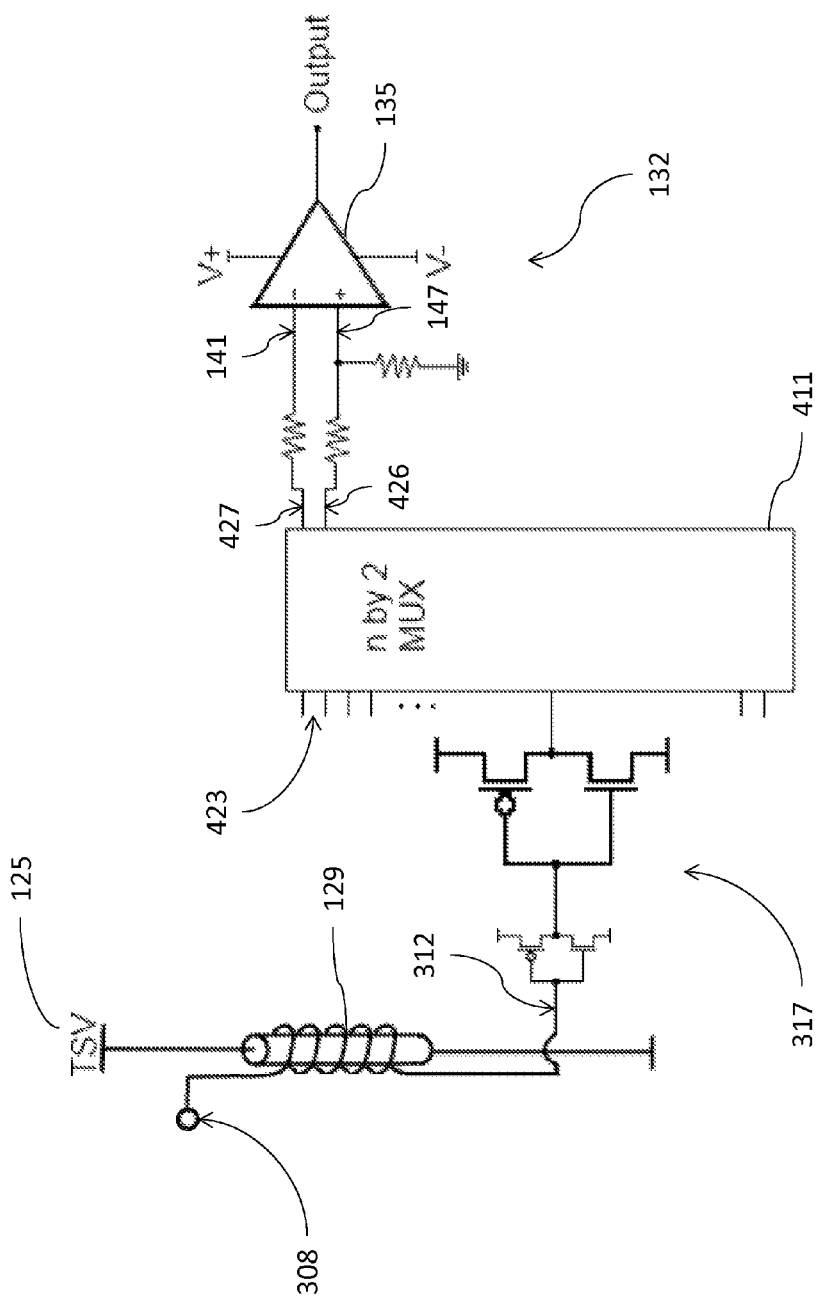
FIG. 4 is a circuit diagram according to devices and methods herein.

FIG. 4 shows a circuit diagram illustrating an example for comparison of a TSV voltage to a configurable signal. In this configuration, the first end 308 of the inductor 129 may be connected to ground or to a sensing connection. The second end 312 of the inductor may be connected to an amplifier 317. Varying current in the TSV 125 is sensed with inductor 129 and amplified by amplifier 317 for evaluation by the comparator circuit 132.

FIG. 4 shows a single TSV 125 in combination with an inductor 129 providing input to a configurable multiplexer (MUX) 411. As shown in FIG. 4, configurable multiplexer 411 may be an n by 2 device. That is, configurable multiplexer 411 may have multiple inputs 423 and two outputs 426, 427. The configuration shown in FIG. 4 allows for different inputs to be compared to each other. For example:
   Compare TSV to TSV
   Compare a TSV signal to an internal signal
   Compare TSV noise to other noise levels
   Compare a TSV signal to a known value from other circuits.

According to devices and methods herein, one or more inductors are built around the TSVs of a wafer structure or an inductor is formed around a wire in order to be able to measure current in the inductor from which a resistance of the TSV or wire may be calculated as a changing voltage is applied to the TSV or wire. Such current measurement may be used in real time on the die in order to measure and signal events on a voltage supply rail, i.e. voltage spikes, dips, or min/max voltage level sensing. This can then be fed back into reliability data to see what events may have led to failure. Moreover, the TSV that saw the spike may be flagged to localize where the event occurred for rough fault localization/isolation data to minimize failure analysis time.

In some cases, by having a dedicated TSV as a baseline measurement, all other TSVs may be compared to the signal that the inductor senses. This can be used to indirectly measure overall current through the die over a period of time. Logic attached to the sense circuit can flag if and when an event occurred which may result in a positive or negative voltage spike on a rail, in a certain location.

Additionally, with the information gathered from measuring the induced voltage it becomes possible to level sense across different voltage regimes on the die. Competing regimes, or faults within a regime may be flagged as they occur. Operation of the die may then be adapted.

Figure 5:
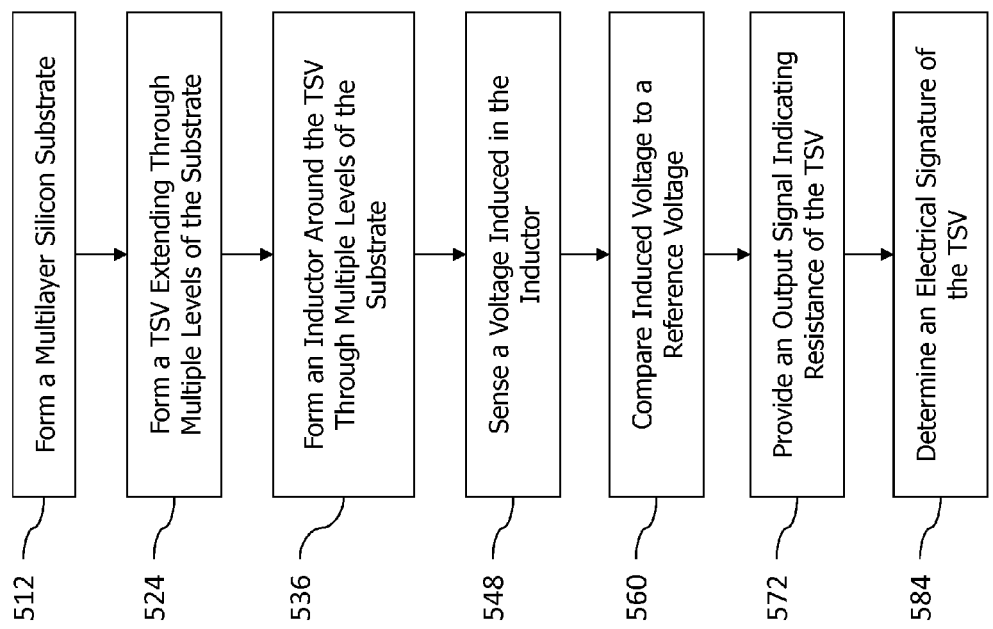
FIG. 5 is a flow diagram according to methods herein.

FIG. 5 is a flow diagram illustrating the processing flow of an exemplary method of monitoring signals in a through-silicon-via (TSV) using a multilayer inductor according to devices and methods herein. At 512, a wafer comprising a multilayer silicon substrate is formed. A TSV structure is formed, extending through multiple levels of the multilayer silicon substrate, at 524. An inductor is formed in the multilayer silicon substrate surrounding the TSV through multiple levels of the multilayer silicon substrate, at 536. In other words, a multi-level inductor is created around the TSV in the semiconductor substrate. At 548, a voltage induced in the multi-level inductor by current flowing in the TSV is sensed. The induced voltage is compared to a reference voltage, at 560. At 572, an output signal indicating resistance of the TSV is provided based on the comparing the induced voltage to the reference voltage. At 584, an electrical signature of the TSV is determined based on comparing the induced voltage to the reference voltage.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

Aspects of the present disclosure are described herein with reference to flowchart illustrations and/or block diagrams of methods, apparatus (systems), and computer program products according to various devices and methods. It will be understood that each block of the flowchart illustrations and/or two-dimensional block diagrams, and combinations of blocks in the flowchart illustrations and/or block diagrams, can be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

According to a further devices and methods herein, an article of manufacture is provided that includes a tangible computer readable medium having computer readable instructions embodied therein for performing the steps of the computer implemented methods, including, but not limited to, the method illustrated in FIG. 5. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. Any of these devices may have computer readable instructions for carrying out the steps of the methods described above with reference to FIG. 5.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Furthermore, the computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In case of implementing the devices and methods herein by software and/or firmware, a program constituting the software may be installed into a computer with dedicated hardware, from a storage medium or a network, and the computer is capable of performing various functions if with various programs installed therein.

Figure 6:
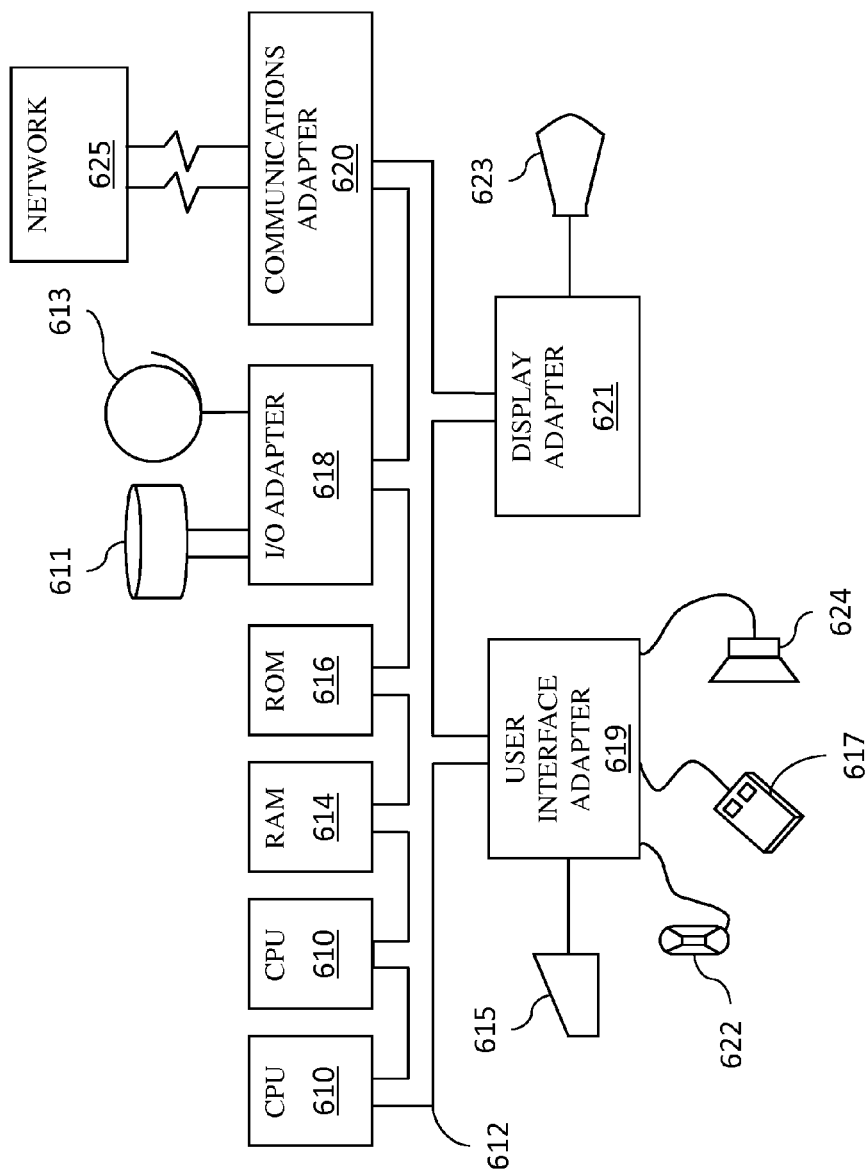
FIG. 6 is a schematic diagram of a hardware system according to devices and methods herein.

A representative hardware environment for practicing the devices and methods herein is depicted in FIG. 6. This schematic drawing illustrates a hardware configuration of an information handling/computer system in accordance with the devices and methods herein. The system comprises at least one processor or central processing unit (CPU) 610. The CPUs 610 are interconnected via system bus 612 to various devices such as a Random Access Memory (RAM) 614, Read-Only Memory (ROM) 616, and an Input/Output (I/O) adapter 618. The I/O adapter 618 can connect to peripheral devices, such as disk units 611 and tape drives 613, or other program storage devices that are readable by the system. The system can read the inventive instructions on the program storage devices and follow these instructions to execute the methodology of the devices and methods herein.

In FIG. 6, CPUs 610 perform various processing based on a program stored in a Read Only Memory (ROM) 616 or a program loaded from a peripheral device, such as disk units 611 and tape drives 613 to a Random Access Memory (RAM) 614. In the RAM 614, required data when the CPUs 610 perform the various processing or the like is also stored, as necessary. The CPUs 610, the ROM 616, and the RAM 614 are connected to one another via a bus 612. An I/O adapter 618 is also connected to the bus 612 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 614, as necessary.

The system further includes a user interface adapter 619 that connects a keyboard 615, mouse 617, speaker 624, microphone 622, and/or other user interface devices such as a touch screen device (not shown) to the bus 612 to gather user input. Additionally, a communication adapter 620 including a network interface card such as a LAN card, a modem, or the like connects the bus 612 to a data processing network 625. The communication adapter 620 performs communication processing via a network such as the Internet. A display adapter 621 connects the bus 612 to a display device 623, which may be embodied as an output device such as a monitor (such as a Cathode Ray Tube (CRT), a Liquid Crystal Display (LCD), or the like), printer, or transmitter, for example.

In the case where the above-described series of processing is implemented with software, the program that constitutes the software may be installed from a network such as the Internet or a storage medium such as the removable medium.

Those skilled in the art would appreciate that the storage medium is not limited to the peripheral device having the program stored therein as illustrated in FIG. 6, which is distributed separately from the device for providing the program to the user. Examples of a removable medium include a magnetic disk (including a floppy disk), an optical disk (including a Compact Disk-Read Only Memory (CD-ROM) and a Digital Versatile Disk (DVD)), a magneto-optical disk (including a Mini-Disk (MD) (registered trademark)), and a semiconductor memory. Alternatively, the storage medium may be the ROM 616, a hard disk contained in the storage section of the disk units 611, or the like, which has the program stored therein and is distributed to the user together with the device that contains them.

As will be appreciated by one skilled in the art, aspects of the devices and methods herein may be embodied as a system, method, or computer program product. Accordingly, aspects of the present disclosure may take the form of an entirely hardware system, an entirely software system (including firmware, resident software, micro-code, etc.) or an system combining software and hardware aspects that may all generally be referred to herein as a "circuit," "module", or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a Read-Only Memory (ROM), an Erasable Programmable Read-Only Memory (EPROM or Flash memory), an optical fiber, a magnetic storage device, a portable compact disc Read-Only Memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The flowchart and block diagrams in the Figures illustrate the architecture, functionality, and operation of possible implementations of systems, methods, and computer program products according to various devices and methods herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment types include loading directly in the client, server, and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Alternatively, the process software is sent directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

While it is understood that the process software may be deployed by manually loading directly in the client, server, and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

Figure 7:
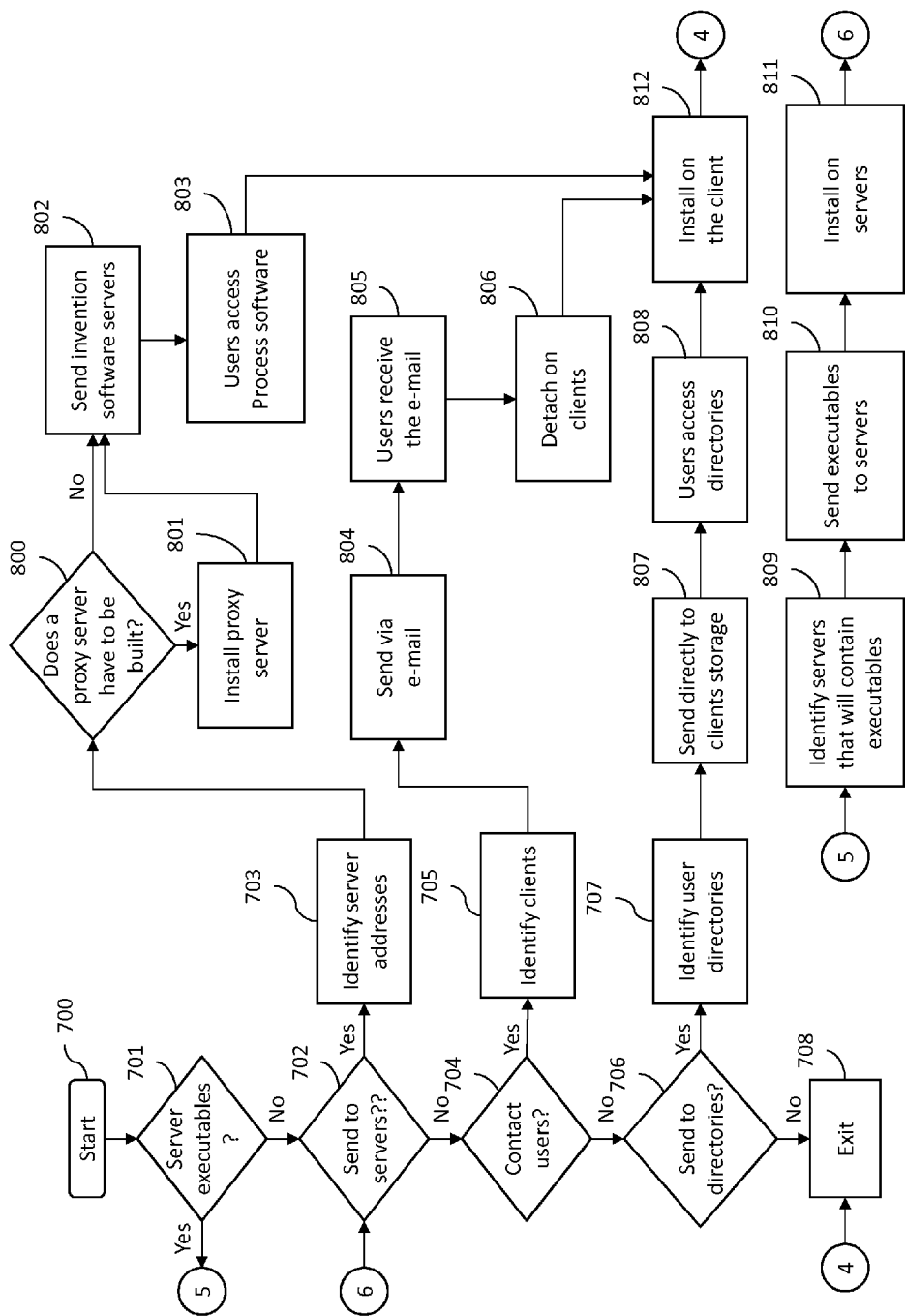
FIG. 7 is a schematic diagram of a deployment system according to devices and methods herein.

In FIG. 7, step 700 begins the deployment of the process software. The first thing is to determine if there are any programs that will reside on a server or servers when the process software is executed 701. If this is the case, then the servers that will contain the executables are identified 809. The process software for the server or servers is transferred directly to the servers' storage via FTP or some other protocol, or by copying through the use of a shared file system 810. The process software is then installed on the servers 811.

Next, a determination is made on whether the process software is to be deployed by having users access the process software on a server or servers 702. If the users are to access the process software on servers, then the server addresses that will store the process software are identified 703.

A determination is made if a proxy server is to be built 800 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required, then the proxy server is installed 801. The process software is either sent to the servers via a protocol such as FTP or it is copied directly from the source files to the server files via file sharing 802. Another method would be to send a transaction to the servers that contain the process software and have the server process the transaction, then receive and copy the process software to the server's file system. Once the process software is stored at the servers, the users, via their client computers, then access the process software on the servers and copy it to their client computers' file systems 803. Another method is to have the servers automatically copy the process software to each client and then run the installation program for the process software at each client computer. The users execute the program that installs the process software on their client computer 812, and then exit the process 708.

In step 704, a determination is made whether the process software is to be deployed by sending the process software to users via e-mail. The set of users where the process software will be deployed are identified together with the addresses of the user client computers 705. The process software is sent via e-mail 804 to each of the users' client computers. The users receive the e-mail 805 and then detach the process software from the e-mail to a directory on their client computers 806. The users execute the program that installs the process software on their client computer 812, and then exit the process 708.

Lastly, a determination is made on whether the process software will be sent directly to user directories on their client computers 706. If so, the user directories are identified 707. The process software is transferred directly to the users' client computer directory 807. This can be done in several ways such as, but not limited to, sharing of the file system directories and then copying from the sender's file system to the recipient users' file system or alternatively using a transfer protocol such as File Transfer Protocol (FTP). The users access the directories on their client file systems in preparation for installing the process software 808. The users execute the program that installs the process software on their client computer 812, and then exit the process 708.

The process software is integrated into a client, server, and network environment by providing for the process software to coexist with applications, operating systems, and network operating systems software, and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists match the parameter lists required by the process software. Conversely, parameters passed by the software applications to the process software will be checked to ensure the parameters match the parameters required by the process software. The client and server operating systems including the network operating systems will be identified and compared to the list of operating systems, version numbers, and network software that have been tested to work with the process software. Those operating systems, version numbers, and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 8:
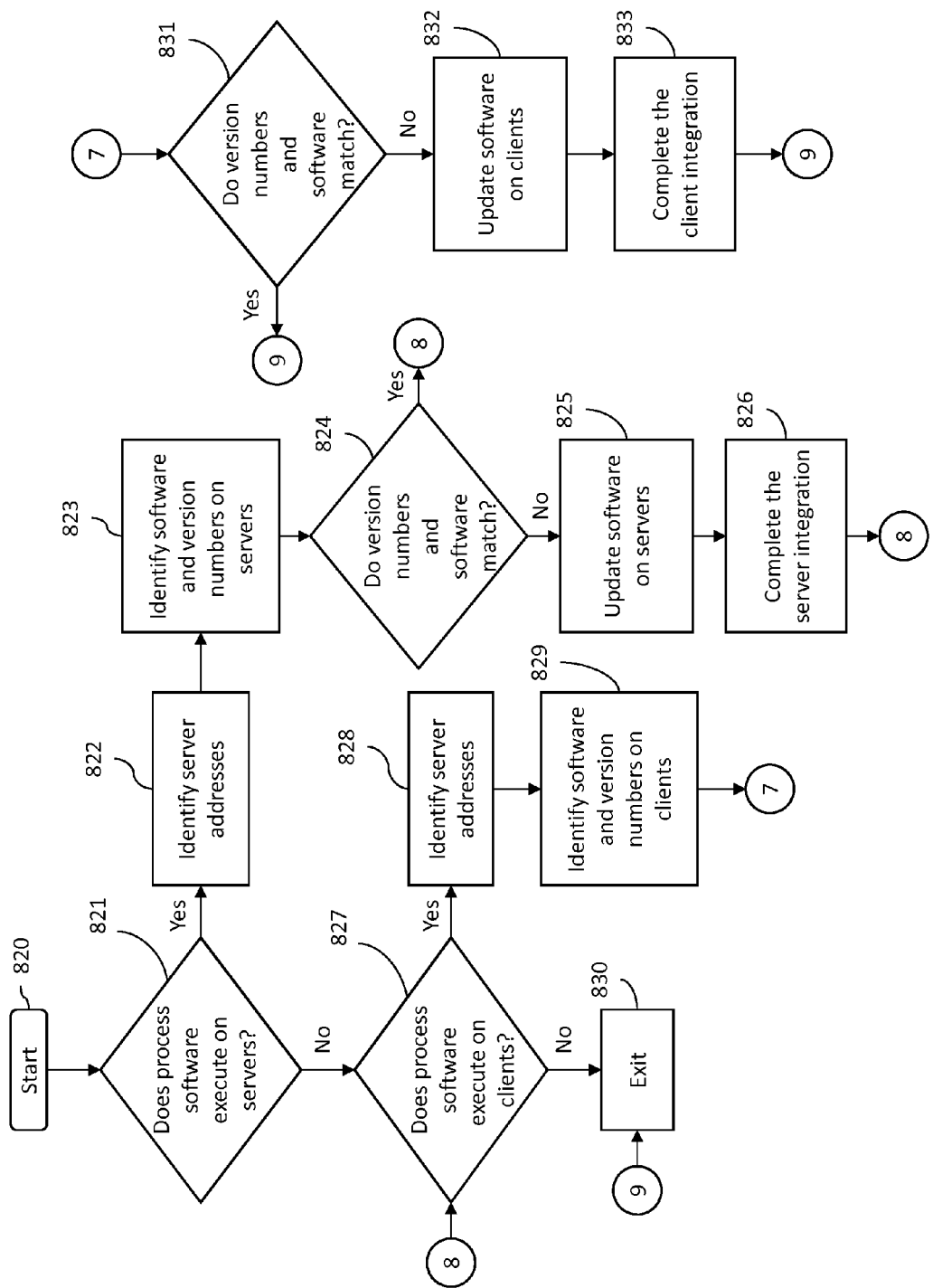
FIG. 8 is a schematic diagram of an integration system according to devices and methods herein.

In FIG. 8, step 820 begins the integration of the process software. The first thing is to determine if there are any process software programs that will execute on a server or servers 821. If this is not the case, then integration proceeds to 827. If this is the case, then the server addresses are identified 822. The servers are checked to see if they contain software that includes the operating system (OS), applications, and network operating systems (NOS), together with their version numbers that have been tested with the process software 823. The servers are also checked to determine if there is any missing software that is required by the process software 823.

A determination is made if the version numbers match the version numbers of OS, applications, and NOS that have been tested with the process software 824. If all of the versions match and there is no missing required software, the integration continues in 827.

If one or more of the version numbers do not match, then the unmatched versions are updated on the server or servers with the correct versions 825. Additionally, if there is missing required software, then it is updated on the server or servers 825. The server integration is completed by installing the process software 826.

Step 827, which follows either step 821, 824, or 826, determines if there are any programs of the process software that will execute on the clients. If no process software programs execute on the clients, the integration proceeds to 830 and exits. If this is not the case, then the client addresses are identified at 828.

The clients are checked to see if they contain software that includes the operating system (OS), applications, and network operating systems (NOS), together with their version numbers that have been tested with the process software 829. The clients are also checked to determine if there is any missing software that is required by the process software 829.

A determination is made as to whether the version numbers match the version numbers of OS, applications, and NOS that have been tested with the process software 831. If all of the versions match and there is no missing required software, then the integration proceeds to 830 and exits.

If one or more of the version numbers do not match, then the unmatched versions are updated on the clients with the correct versions 832. In addition, if there is missing required software then it is updated on the clients 832. Installing the process software on the clients 833 completes the client integration. The integration proceeds to 830 and exits.

The process software is shared, simultaneously serving multiple customers in a flexible, automated fashion. It is standardized, requiring little customization, and it is scalable, providing capacity On-Demand in a pay-as-you-go model.

The process software can be stored on a shared file system accessible from one or more servers. The process software is executed via transactions that contain data and server processing requests that use CPU units on the accessed server. CPU units are units of time such as minutes, seconds, and hours on the central processor of the server. Additionally, the assessed server may make requests of other servers that require CPU units. CPU units are an example that represents one measurement of use. Other measurements of use include, but are not limited to, network bandwidth, memory usage, storage usage, packet transfers, complete transactions, etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise, when other measurements of use, such as network bandwidth, memory usage, storage usage, etc. approach a capacity so as to affect performance, additional network bandwidth, memory usage, storage, etc., are added to share the workload.

The measurements of use that are used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and/or indicated on a web site accessed by the customer, which then remits payment to the service provider.

In another method, the service provider requests payment directly from a customer account at a banking or financial institution.

In another method, if the service provider is also a customer of the customer that uses the process software application, the payment owed to the service provider is reconciled to the payment owed by the service provider to minimize the transfer of payments.

Figure 9:
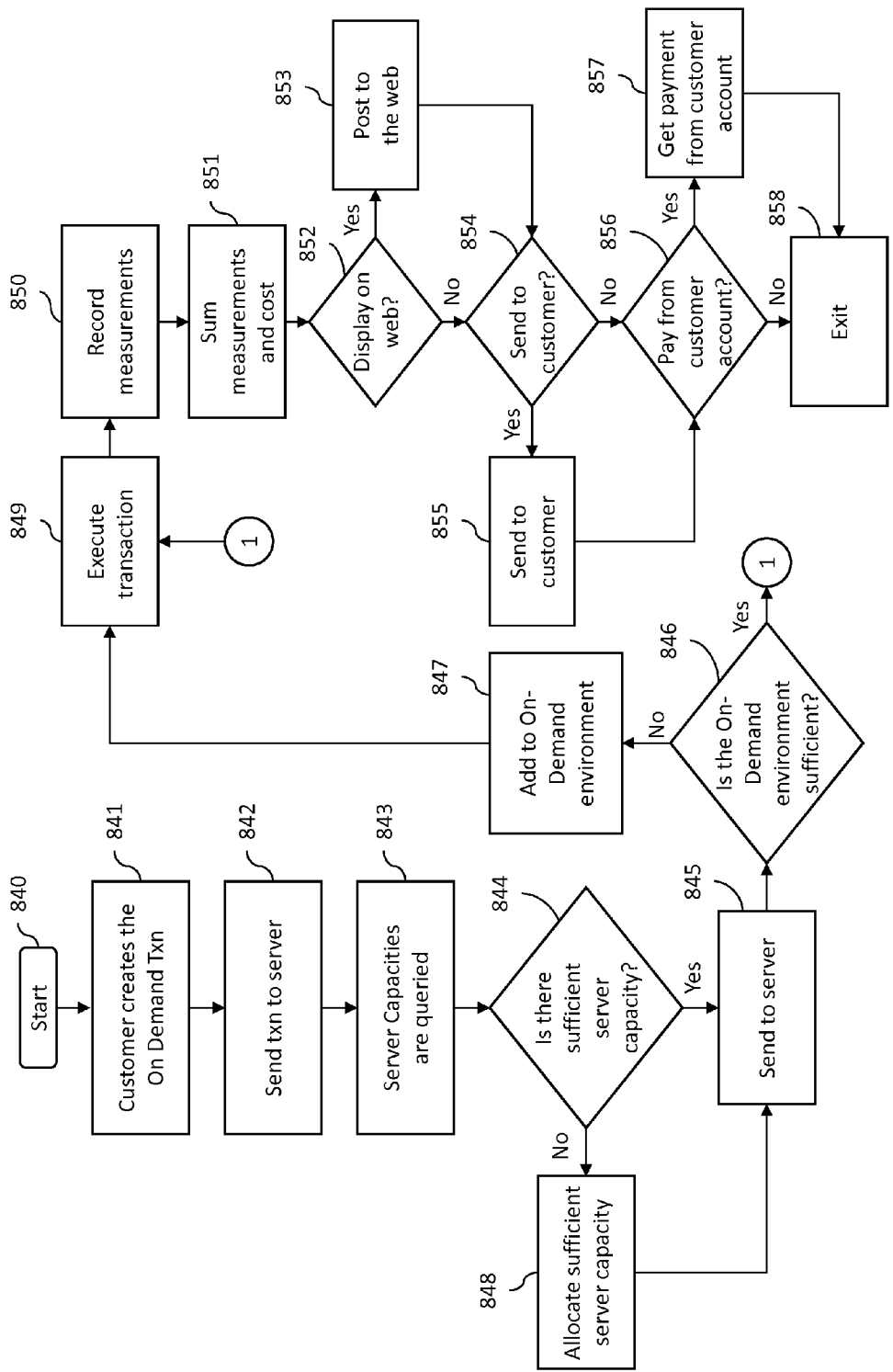
FIG. 9 is a schematic diagram of an On-Demand system according to devices and methods herein.

In FIG. 9, step 840 begins the On-Demand process. A transaction is created that contains the unique customer identification, the requested service type, and any service parameters that further specify the type of service 841. The transaction is then sent to the main server 842. In an On-Demand environment, the main server can initially be the only server, then, as capacity is consumed, other servers are added to the On-Demand environment.

The server central processing unit (CPU) capacities in the On-Demand environment are queried 843. The CPU requirement of the transaction is estimated, and then the servers' available CPU capacity in the On-Demand environment is compared to the transaction CPU requirement to see if there is sufficient CPU capacity available in any server to process the transaction 844. If there is not sufficient server CPU capacity available, then additional server CPU capacity is allocated to process the transaction 848. If there was already sufficient CPU capacity available, then the transaction is sent to a selected server 845.

Before executing the transaction, a check is made of the remaining On-Demand environment to determine if the environment has sufficient available capacity for processing the transaction. This environment capacity consists of such things as, but not limited to, network bandwidth, processor memory, storage etc. 846. If there is not sufficient available capacity, then capacity will be added to the On-Demand environment 847. Next, the required software to process the transaction is accessed, loaded into memory, and then the transaction is executed 849.

The usage measurements are recorded 850. The usage measurements consist of the portions of those functions in the On-Demand environment that are used to process the transaction. The usage of such functions as, but not limited to, network bandwidth, processor memory, storage, and CPU cycles are what are recorded. The usage measurements are summed, multiplied by unit costs, and then recorded as a charge to the requesting customer 851. If the customer has requested that the On-Demand costs be posted to a web site 852, then they are posted 853.

If the customer has requested that the On-Demand costs be sent via e-mail to a customer address 854, then they are sent 855. If the customer has requested that the On-Demand costs be paid directly from a customer account 856, then payment is received directly from the customer account 857. The last step is to exit the On-Demand process 858.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed, and executed through either a remote-access or a site-to-site VPN. When using the remote-access VPNs, the process software is deployed, accessed, and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download, and execute the process software.

When using the site-to-site VPN, the process software is deployed, accessed, and executed through the use of dedicated equipment and large-scale encryption, which are used to connect a company's multiple fixed sites over a public network, such as the Internet.

The process software is transported over the VPN via tunneling, which is the process of placing an entire packet within another packet and sending it over a network. The protocol of the outer packet is understood by the network and both points, called tunnel interfaces, where the packet enters and exits the network.

Figure 10:
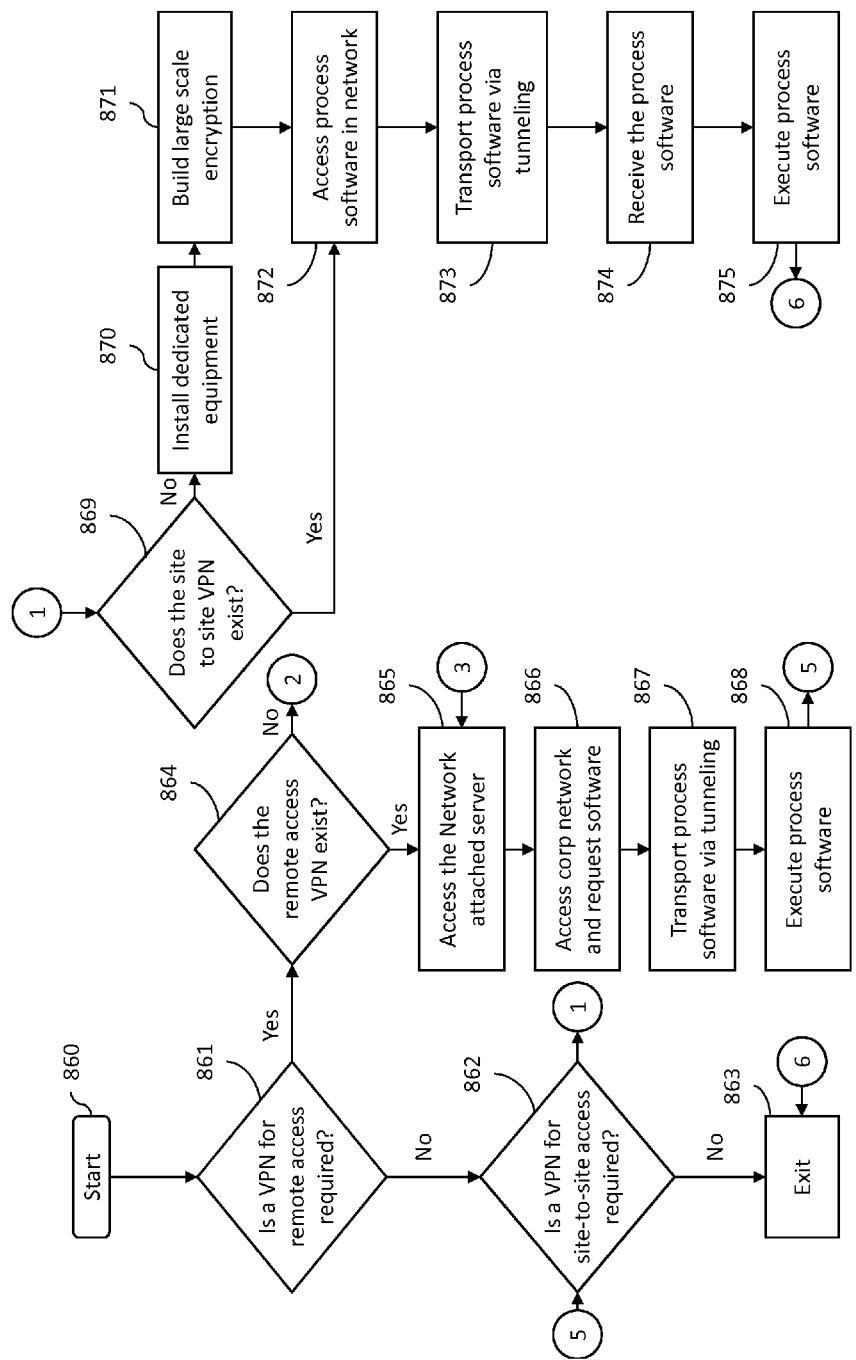
FIG. 10 is a schematic diagram of a virtual private network system according to devices and methods herein.
Figure 11:
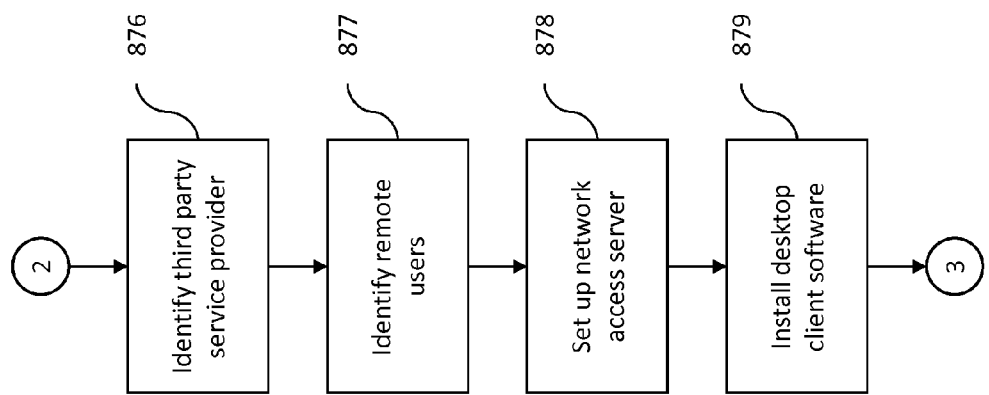
FIG. 11 is a schematic diagram of a virtual private network system according to devices and methods herein.

In FIGS. 10 and 11, step 860 begins the Virtual Private Network (VPN) process. A determination is made to see if a VPN for remote access is required 861. If it is not required, then proceed to 862. If it is required, then determine if the remote access VPN exists 864.

If it does exist, then proceed to 865. Otherwise, identify the third party provider that will provide the secure, encrypted connections between the company's private network and the company's remote users 876. The company's remote users are identified 877. The third party provider then sets up a network access server (NAS) 878 that allows the remote users to dial a toll-free number or attach directly via a cable or DSL modem to access, download, and install the desktop client software for the remote-access VPN 879.

After the remote access VPN has been built, or if it been previously installed, the remote users can then access the process software by dialing into the NAS or attaching directly via a cable or DSL modem into the NAS 865. This allows entry into the corporate network where the process software is accessed 866. The process software is transported to the remote users' desktop over the network via tunneling. That is, the process software is divided into packets and each packet, including the data and protocol, is placed within another packet 867. When the process software arrives at the remote users' desktop, it is removed from the packets, reconstituted, and executed on the remote users' desktop 868.

A determination is made to see if a VPN for site-to-site access is required 862. If it is not required, then proceed to exit the process 863. Otherwise, determine if the site-to-site VPN exists 869. If it does exist, then proceed to 872. Otherwise, install the dedicated equipment required to establish a site-to-site VPN 870. Then build the large-scale encryption into the VPN 871.

After the site-to-site VPN has been built, or if it had been previously established, the users access the process software via the VPN 872. The process software is transported to the site users over the network via tunneling 873. That is, the process software is divided into packets and each packet, including the data and protocol, is placed within another packet 874. When the process software arrives at the remote users' desktop, it is removed from the packets, reconstituted, and executed on the site users' desktop 875. Proceed to exit the process 863.

The terminology used herein is for the purpose of describing particular devices and methods only and is not intended to be limiting of this disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods herein have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

What is claimed is:

1. A structure for identifying failed components in an integrated circuit, said structure comprising:
   a wafer comprising a multilayer silicon substrate;
   an active device in a layer of said multilayer silicon substrate;
   a through-silicon-via (TSV) structure extending through multiple levels of said multilayer silicon substrate and operatively attached to said active device, said TSV passing electrical current between layers of said multilayer silicon substrate;
   a single multi-level coil inductor in said multilayer silicon substrate, said single multi-level coil inductor surrounding said TSV and extending through multiple levels of said multilayer silicon substrate; and
   a comparator having multiple inputs, a reference voltage being applied to a first input of said comparator,
   said single multi-level coil inductor being connected to ground at a first end and connected to a second input of said comparator at a second end,
   said electrical current in said TSV inducing measured voltage in said single multi-level coil,
   said comparator having a structure that compares said reference voltage to said measured voltage, and
   said comparator having a structure that outputs an indication of failure of said TSV based on said measured voltage not matching said reference voltage.

2. The structure according to claim 1, said single multi-level coil inductor being connected to sensing signal at said first end and connected to said second input of said comparator at said second end.

3. The structure according to claim 1, further comprising:
   an amplifier operatively connected between said single multi-level coil inductor and said comparator.

4. The structure according to claim 1, further comprising:
   a multiplexer operatively connected between said single multi-level coil inductor and said comparator.

5. The structure according to claim 4, said multiplexer having multiple TSVs connected as inputs to said multiplexer and a single output to said comparator.

6. The structure according to claim 4, said multiplexer having multiple TSVs connected as inputs to said multiplexer and multiple outputs to said comparator.

7. The structure according to claim 6, said reference voltage comprising one of:
   a voltage induced in another TSV,
   a predetermined voltage, and
   a voltage from another circuit.

8. The structure according to claim 1, said active device comprising one of:
   a transistor,
   a capacitor, and
   a resistor.

9. A device for identifying failed components in an integrated circuit, said device comprising:
   a substrate having multiple layers;
   a through-silicon-via (TSV) extending through said substrate, said TSV passing electrical current through said substrate;
   a single coil inductor surrounding said TSV and extending through said multiple layers of said substrate, said electrical current in said TSV inducing measured voltage in said single coil inductor; and
   a comparator having a structure that compares a reference voltage to said measured voltage,
   said comparator having a structure that outputs an indication of failure of said TSV based on said measured voltage not matching said reference voltage.

10. The device according to claim 9,
    said comparator having said reference voltage applied to a first input of said comparator,
    said single coil inductor having a first end and a second end, said single coil inductor being connected at said first end to ground and being connected at said second end to a second input of said comparator.

11. The device according to claim 10, said reference voltage comprising one of:
    a voltage induced in another TSV,
    a predetermined voltage, and
    a voltage from another circuit.

12. The device according to claim 10, said single coil inductor being connected to a sensing signal at said first end and connected to said second input of said comparator at said second end.

13. The device according to claim 10, further comprising:
    an amplifier operatively connected between said single coil inductor and said comparator.

14. The device according to claim 10, further comprising:
    a multiplexer operatively connected between said single coil inductor and said comparator.

15. The device according to claim 14, said multiplexer being connected to multiple TSVs as inputs to said multiplexer and a single output to said comparator.

16. The device according to claim 14, said multiplexer being connected to multiple TSVs as inputs to said multiplexer and multiple outputs to said comparator.

17. A structure for identifying failed components in an integrated circuit, said structure comprising:
    a substrate having multiple layers;
    an active device in a layer of said substrate;
    a through-silicon-via (TSV) structure extending through said substrate and operatively attached to said active device, said TSV passing electrical current between layers of said substrate;
    a single multi-level coil inductor surrounding said TSV and extending through said multiple layers of said substrate, said electrical current in said TSV inducing measured voltage in said single multi-level coil inductor; and
    a comparator having a structure that compares a reference voltage to said measured voltage, said comparator having a structure that outputs an indication of failure of said TSV based on said measured voltage not matching said reference voltage.

18. The structure according to claim 17, said active device comprising one of:
   a transistor,
   a capacitor, and
   a resistor.

19. The structure according to claim 17, further comprising:
   a comparator having a reference voltage applied to a first input of said comparator,
   said single multi-level coil inductor having a first end and a second end, said single multi-level coil inductor being connected at said first end to a reference signal and being connected at said second end to a second input of said comparator.

20. The structure according to claim 19, further comprising:
   an amplifier operatively connected between said single multi-level coil inductor and said comparator.

* * * * *